(12) United States Patent
Lee et al.

(10) Patent No.: US 7,254,021 B2
(45) Date of Patent: Aug. 7, 2007

(54) ELECTRONIC SYSTEM HAVING A FAN DUCT

(75) Inventors: Hsieh-Kun Lee, Tu-Cheng (TW); Chun-Chi Chen, Tu-Cheng (TW); Shin-Hsuu Wung, Tu-Cheng (TW); Yu Huang, Shenzhen (TW)

(73) Assignees: Fu Zhum Precision Industry (Shenzhen) Co., Ltd., Shenzhen, Guangdong (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 37 days.

(21) Appl. No.: 11/264,986

(22) Filed: Nov. 1, 2005

(65) Prior Publication Data

US 2007/0097630 A1     May 3, 2007

(51) Int. Cl.
    *H05K 7/20* (2006.01)
(52) U.S. Cl. .................. 361/695; 165/104.33; 454/184
(58) Field of Classification Search ................ 361/695; 454/184; 165/104.44
    See application file for complete search history.

(56) References Cited

U.S. PATENT DOCUMENTS 6,094,345 A * 7/2000 Diemunsch ................ 361/695
6,155,920 A * 12/2000 Pan et al. .................... 454/184
6,215,659 B1 * 4/2001 Chen .......................... 361/695
6,343,011 B1 * 1/2002 Yu .............................. 361/695
6,464,578 B1 * 10/2002 Chin et al. .................. 454/184
6,930,882 B2 * 8/2005 Broder et al. ............... 361/695
6,940,716 B1 * 9/2005 Korinsky et al. ........... 361/695
2004/0004812 A1   1/2004 Curlee et al.
2005/0195568 A1 * 9/2005 Shyr ........................... 361/695

FOREIGN PATENT DOCUMENTS

CN           2632851 Y        8/2004

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

A fan duct (8) buckled to a fan (7) is mounted in a computer enclosure (4) having an upper panel (44) defining a plurality of apertures (440). The fan duct includes a first open portion (80) having a first opening (804) and a second open portion (82) having a second opening (822). The first open portion comprises two opposite lateral flanges (802). Each flange forms a pair of latches (806, 808) buckled to the fan to prevent removal of the fan duct in the horizontal direction. A pair of resilient tabs (824) is formed at two opposite lateral sides of the second opening. The tabs are pressed by the upper panel of the computer enclosure to confine the fan duct to move upwardly. The second opening communicates with the apertures and the first opening communicates with the fan.

15 Claims, 5 Drawing Sheets

ELECTRONIC SYSTEM HAVING A FAN DUCT

BACKGROUND

1. Field

The present invention relates to an electronic system, and particularly to an electronic system having a ventilating duct to guide an airflow flowing from an outside of the electronic system to a heat sink in an inside of the electronic system.

2. Prior Art

Electronic devices such as central processing units (CPUs) generate large amounts of heat during normal operation, which can destabilize the electronic devices and cause damage to the electronic devices. Oftentimes, a heat dissipation assembly is used to dissipate heat from an electronic device. The heat dissipation assembly frequently comprises a fan for facilitating removal of heat from the electronic device.

Conventionally, a heat sink is mounted on the electronic device inside a computer. The fan is directly mounted on the heat sink. The fan generates a current of air flowing through the heat sink, to promote heat dissipation into the surrounding air.

To facilitate outside cool air to be drawn by the fan through the heat sink, a fan duct has been developed to guide air flowing into the computer and toward the heat sink. A conventional fan duct assembly is disclosed in China Patent Issue No. 2632851Y. The fan duct assembly comprises a fan mounted to a heat sink secured on a CPU, and a fan duct. The fan duct is fixed to the fan and the heat sink by screws. It is necessary to use a screwdriver or other tool to manipulate the screws. Therefore it is inconvenient for the fan duct to be assembled or disassembled. Another conventional fan duct assembly is disclosed in U.S. Pat. No. 6,215,659 B1. The fan duct assembly comprises a fan duct attached to a computer enclosure for receiving a fan. The fan duct comprises two sidewalls. Each sidewall has a fixing edge adapted for abutting against the computer enclosure. The fan duct is locked to a panel of the computer enclosure via the fixing edges thereof. It is laborious to disassemble the fan duct from the panel of the computer enclosure.

Thus, it is desired to devise a fan duct which is easily to be assembled within and disassembled from a computer enclosure.

SUMMARY

Accordingly, what is needed is an electronic system having a fan duct which is easily assembled and disassembled.

According to an embodiment of the present invention, a fan duct buckled to a fan mounted to a heat sink is attached to a computer enclosure having a panel. The fan duct comprises a first open portion having a first opening and a second open portion having a second opening. The first open portion comprises two opposite lateral flanges and a mounting flange connecting with the two lateral flanges. Each lateral flange forms a pair of latches buckled to the fan to prevent removal of the fan duct in the horizontal direction. A guiding rail is perpendicularly extended inwardly from each lateral flange. The guiding rail forms a bevel adjacent and oriented to the mounting flange to facilitate mounting the fan duct to the fan. The second open portion forms a step adjacent to the first opening to restrict the fan duct to move downwardly. A pair of resilient tabs is formed at two opposite lateral sides of the second opening. The tabs are pressed by the panel of the computer enclosure to confine the fan duct to move upwardly. The panel defines a plurality of apertures communicating with the second opening. The first opening is located close the fan thereby providing an access of the fan to the fan duct.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
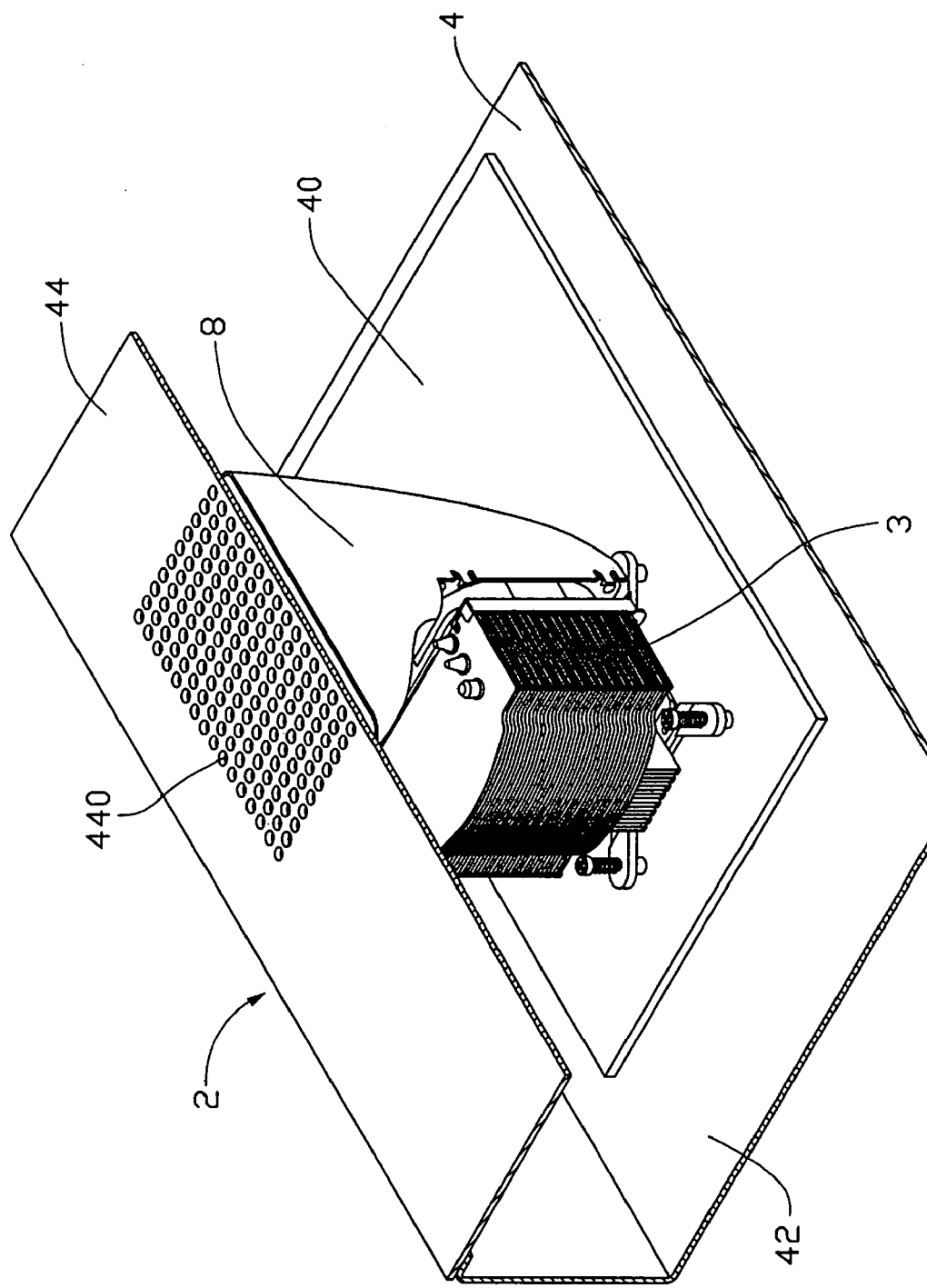
FIG. 1 is a perspective view of a part of an electronic system in accordance with one preferred embodiment of the present invention, wherein a printed circuit board is mounted in the electronic system, a heat sink assembly is assembled to the printed circuit board and a fan duct is secured to the heat sink assembly.

Reference will now be made to the drawing figures to describe an electronic system having a fan duct in accordance with a preferred embodiment of the present invention in details.

FIG. 1 shows an electronic system 2 comprising an enclosure 4 (partially shown), a printed circuit board 40 (PCB) secured on the enclosure 4, a heat sink assembly 3 mounted on the PCB 40 and a fan duct 8 attached to the heat sink assembly 3. The enclosure 4 comprises a first panel 42 and a second panel 44. The PCB 40 is parallel and adjacent to the first panel 42. The second panel 44 defines a plurality of apertures 440. The second panel 44 is located above and parallel to the first panel 42.

Figure 2:
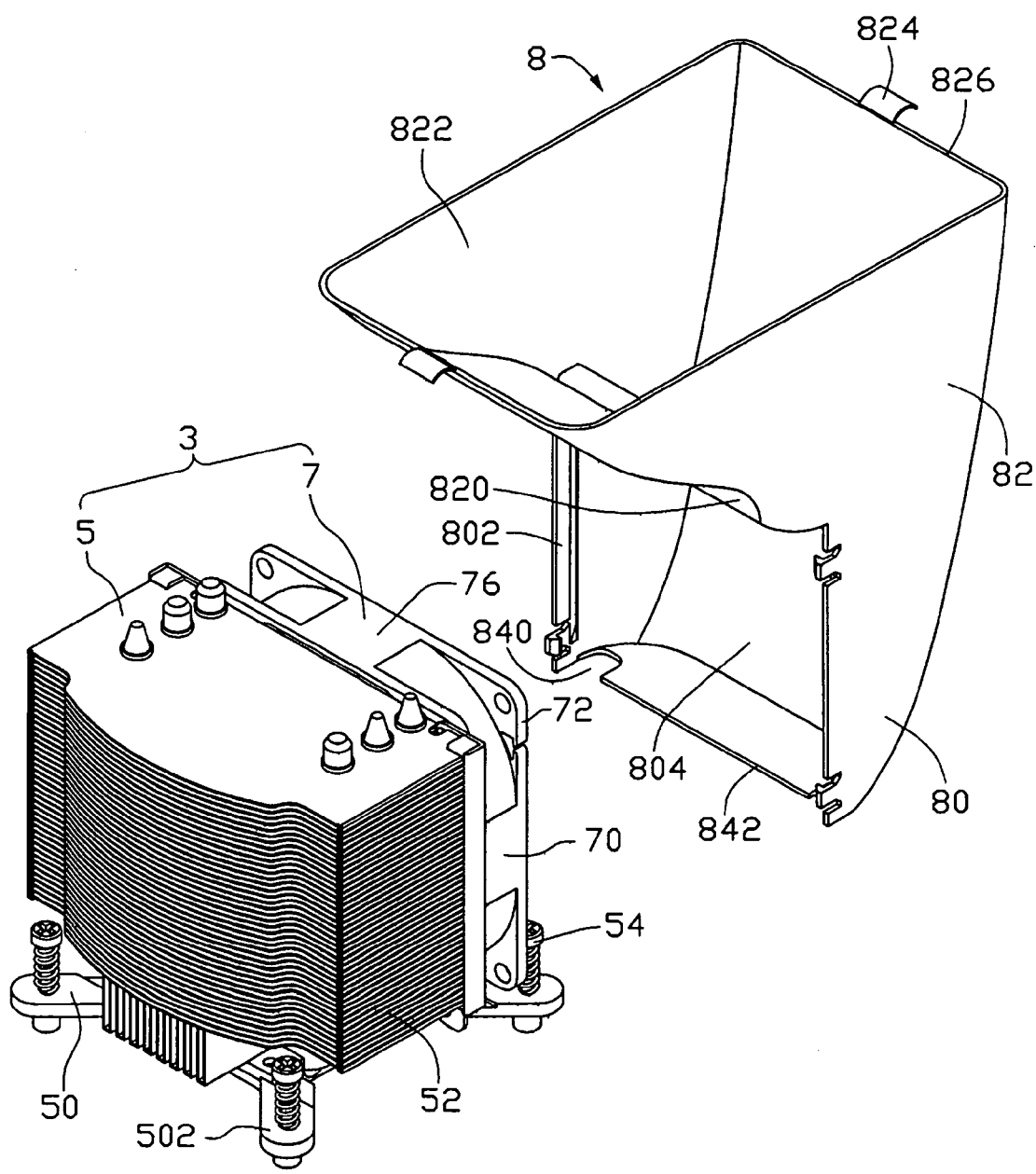
FIG. 2 is an exploded view of the fan duct and the heat sink assembly of FIG. 1.

Referring also to FIG. 2, the heat sink assembly 3 comprises a heat sink 5 and a fan 7 attached to a side of the heat sink 5. The heat sink 5 comprises a heat spreader 50 and a plurality of fins 52 extending from the spreader 50. The heat spreader 50 forms four ears 502 extending outwardly from four corners thereof. The heat sink 5 thermally engages with a CPU (not shown) mounted on the PCB 40 by extending four fasteners 54 through the four ears 502 to threadedly engage with a retainer (not shown) attached to a bottom side of the PCB 40. The fan 7 has a square configuration, and comprises a pair of opposite longitudinal sides 70 and a top portion 76.

Figure 3:
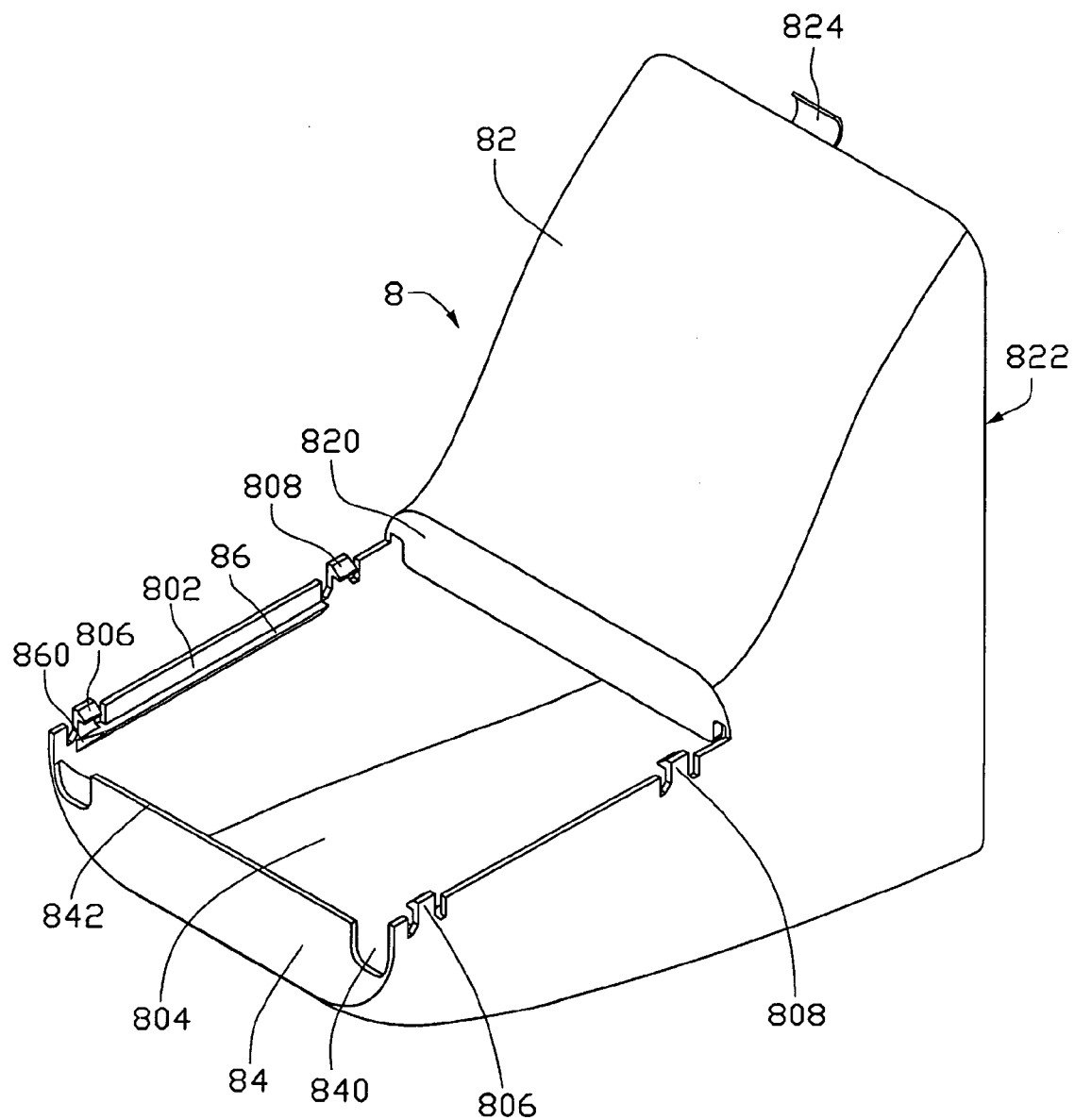
FIG. 3 is an enlarged perspective view of the fan duct of FIG. 1 from a different aspect.

Referring also to FIGS. 2-3, the fan duct 8 is buckled to the fan 7, and comprises a first open portion 80 and a second open portion 82 communicating with the first open portion 80. The first open portion 80 comprises two opposite lateral flanges 802, a mounting flange 84 connecting with the two lateral flanges 802, and a first opening 804. Each lateral flange 802 forms a pair of latches 806, 808 for engaging with the fan 7. The latches 806 are adjacent to the mounting flange 84. The latches 808 are adjacent to the second open portion 82. A guiding rail 86 is perpendicularly extended inwardly from each flange 802 into the first opening 804. The guiding rail 86 forms a bevel 860 adjacent and oriented to the mounting flange 84 to facilitate mounting the fan duct 8 to the fan 7. The mounting flange 84 defines a pair of cutouts 840 adjacent to the lateral flanges 802 for permitting passage of the fasteners 54 in the mounting flange 84. The mounting flange 84 forms an edge 842 for abutting against the fan 7. The second open portion 82 has a substantially trapeziform configuration, and forms a step 820 adjacent to the first opening 804. A second opening 822 is defined at the second open portion 82, for providing an access for an airflow from an outside of the enclosure 4 through the apertures 440 of the second panel 44 into the fan duct 8. The second opening 822 has a square configuration. A pair of resilient tabs 824 is formed at a pair of opposite lateral sides 826 of the second opening 822. The resilient tabs 824 project upwardly and outwardly. The first and second openings 804, 822 are so oriented that they are perpendicular to each other.

Figure 4:
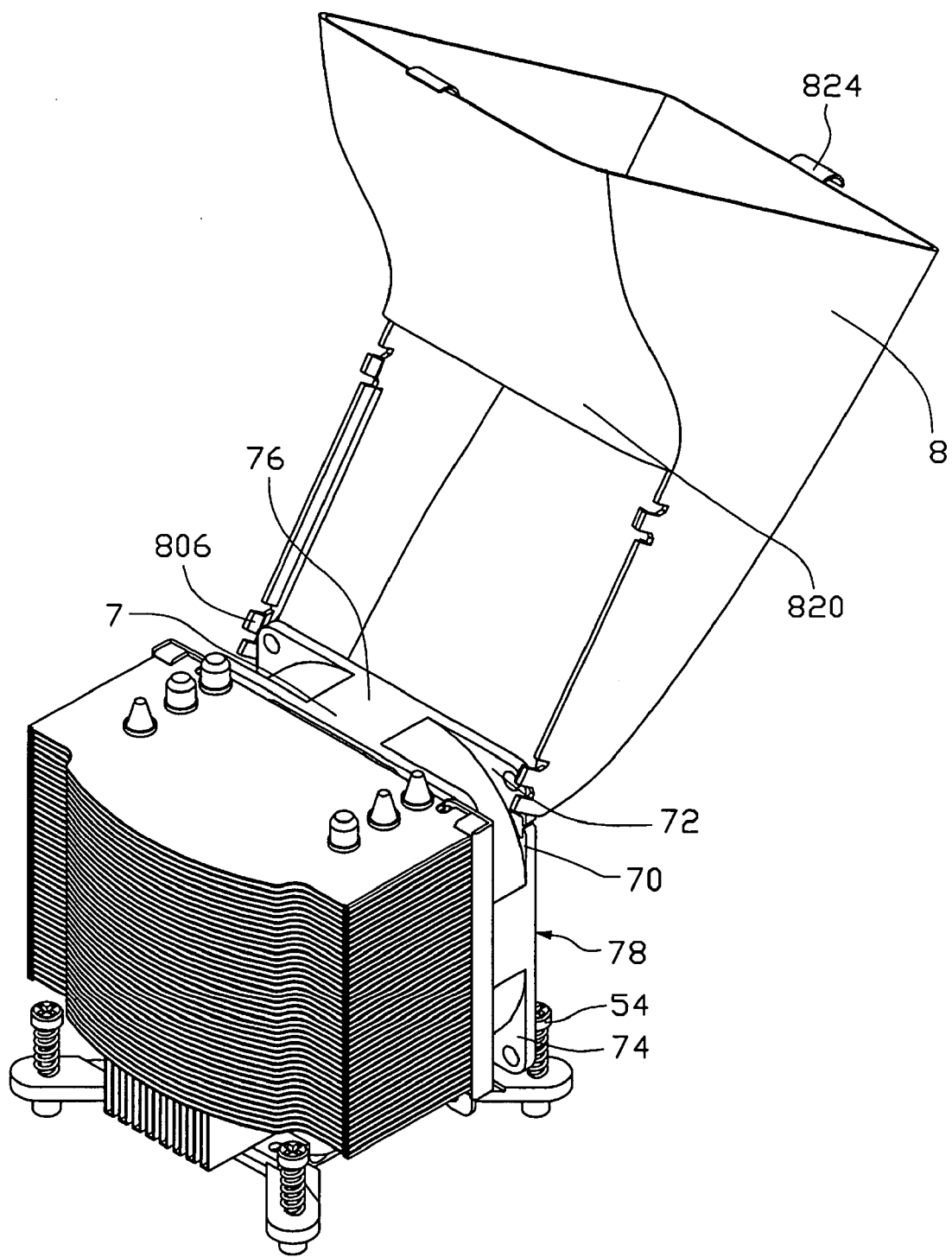
FIG. 4 is a pre-assembled view of FIG. 2.
Figure 5:
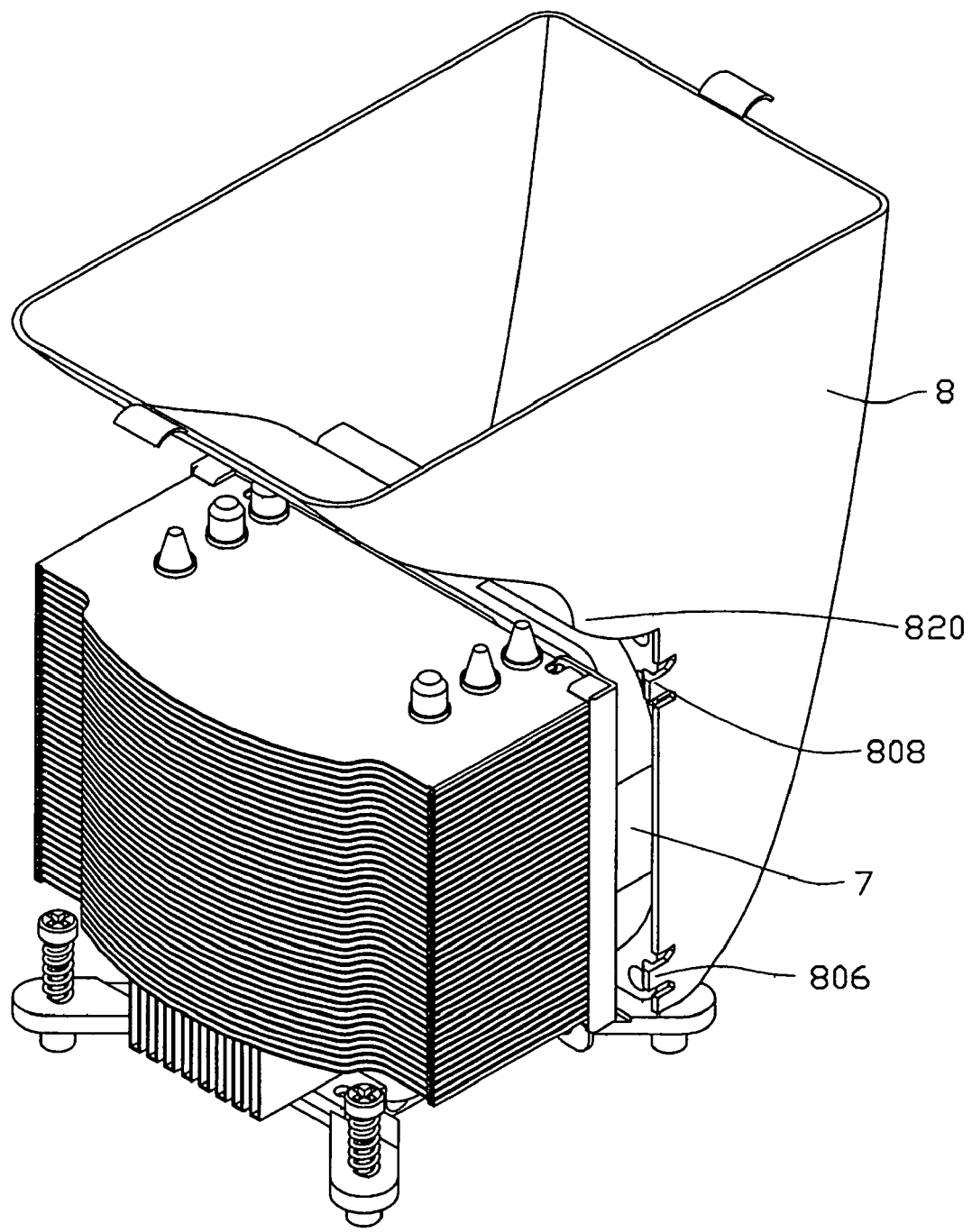
FIG. 5 is an assembled view of FIG. 2.

Referring to FIGS. 1 and 4-5, in assembly, the heat sink assembly 3 is mounted to the PCB 40 by extending the fasteners 54 through the PCB 40 to threadedly engage with the retainer (not shown) on the bottom side of the PCB 40. The heat spreader 50 thermally engages with the CPU (not shown) on the PCB 40. The fan duct 8 is first brought in an inclined manner to have the bevels 860 of the guiding rails 86 of the fan duct 8 abutting against an outer face of upper portions 72 of the longitudinal sides 70 of the fan 7. The latches 806 engage an inner face of the upper portions 72. The fan duct 8 is then oriented vertically and moved downwardly toward the PCB 40. During the downward movement, the lateral flanges 802 of the fan duct 8 slide along the longitudinal sides 70 of the fan 7 towards lower portions 74 of the longitudinal sides 70. The latches 806 slide to the lower portions 74 and lock to the lower portions 74 of the longitudinal sides 70. The guiding rails 86 abut against the outer face of the longitudinal sides 70 of the fan 7. Simultaneously the latches 808 lock to the upper portions 72 and the longitudinal sides 70 abut against the lateral flanges 802 such that the fan duct 8 is positioned to the fan 7 and cannot move in the horizontal direction. The first opening 804 is oriented and close to a front side 78 of the fan 7 for providing an access of the fan 7 to the fan duct 8. The step 820 abuts against the top portion 76 of the fan 7 such that a downward movement of fan duct 8 is prevented. The fasteners 54 adjacent to the fan 7 pass through the cutouts 840 of the mounting flange 84 until the mounting flange 84 sits on the two ears 502 below the fan 7, and the edge 842 abuts against the fan 7. Referring back to FIG. 1, the second panel 44 is placed on the enclosure 4. The apertures 440 are directed to and communicate with the second opening 822. The tabs 824 are resiliently pressed downwardly by the second panel 44 such that the fan duct 8 is restricted to move upwardly. Thus, the assembly of the electronic system 2 is completed.

When the fan 7 operates, an airflow is generated flowing through the apertures 440 and the second opening 822 into the fan duct 8. The airflow then flows through the first opening 804 and the fan 7 to reach the fins 52. From the fins 7, the airflow takes heat away into surrounding air. The fins 52 absorb the heat from the CPU. Accordingly, the heat generated by the CPU can be quickly dissipated.

During disassembly of the fan duct 8, the second panel 44 is detached from the enclosure 4. The fan duct 8 is disassembled from the fan 7 by simply pulling the fan duct 8 upwardly relative to the fan 7 until the fan duct 8 is totally separated from the fan 7.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A fan duct assembly, comprising:
   a fan having a top side, a bottom side opposite to the top side, and a pair of opposite and parallel lateral sides connected with the top and bottom sides; and
   a fan duct comprising:
   a first open portion, comprising a first opening orienting to a front side of the fan, a pair of opposite and parallel lateral flanges located beside the first opening, each lateral flange having latches for being buckled to a corresponding lateral side of the fan, and a guiding rail perpendicularly extending from the each flange into the first opening, the guiding rails being parallel to the lateral sides of the fan and engaging with the lateral sides of the fan, wherein the fan duct is first brought in an inclined manner to have the guiding rails of the fan duct abutting against the lateral sides of the fan around the top side of the fan with the latches buckled with the lateral sides of the fan and then the fan duct is oriented vertically and moved along the fan from the top side to the bottom side of the fan such that the fan duct is mounted on the front side of the fan; and
   a second open portion connecting with the first open portion and having a second opening in communication with the first opening, resilient tabs being formed at opposite edges of the second opening.

2. The fan duct assembly of claim 1, wherein the guiding rail forms a bevel to facilitate mounting the fan duct to the fan at one end thereof.

3. The fan duct assembly of claim 1, wherein the second open portion forms a step adjacent to the first opening, the step abuts against the top side of the fan to restrict the fan duct to move downwardly relative to the fan.

4. The fan duct assembly of claim 1, wherein the second open portion comprises a mounting flange connected with the lateral flanges thereof, for abutting against the fan.

5. An electronic system comprising:
   an enclosure comprising a panel;
   a heat sink assembly mounted in the enclosure, comprising a heat sink and a fan attached to the heat sink; and
   a fan duct comprising a first open portion and a second open portion, the first open portion comprising a first opening, a pair of opposite lateral flanges having latches buckled to the fan, a guiding rail perpendicularly extended inwardly from each of the lateral flanges and engaging with the fan, a bevel formed at one end of the guiding rail to facilitate mounting of the fan duct to the fan, the second open portion comprising a second opening in communication with the first opening, resilient tabs formed at opposite edges of the second opening and abutting against the panel to prevent the fan duct from moving upwardly, and a step formed adjacent to the first opening and abutting against a top portion of the fan to restrict the fan duct to move downwardly relative to the fan.

6. The electronic system of claim 5, wherein the first open portion comprises a mounting flange connected with the lateral flanges thereof, for abutting against the fan.

7. The electronic system of claim 6, wherein the heat sink comprises a heat spreader having four ears, a plurality of fins extending upwardly from the heat spreader, and four fasteners extending through the four ears.

8. The electronic system of claim 7, wherein the mounting flange defines a pair of cutouts at an edge thereof, the cutouts are adjacent to the lateral flanges of the first open portion for permitting passage of the fasteners.

9. The electronic system of claim 5, wherein the fan has a front side, the first opening is oriented and close to the front side of the fan for providing an access of the fan to the fan duct.

10. The electronic system of claim 5, wherein the panel defines a plurality of apertures communicating with the second opening.

11. The electronic system of claim 5, wherein the first open portion comprises a mounting flange connected with the lateral flanges thereof the mounting flange abutting against a bottom portion of the fan, the step and the mounting flange being located at two opposite top and bottom sides of the first opening and cooperatively restricting the fan duct to move relative to the fan.

12. An electronic system comprising:
   an enclosure comprising a first panel and a second panel defining a plurality of apertures;
   a printed circuit board mounted on the first panel;
   a heat generating electronic component mounted on the printed circuit board;
   a heat sink mounted on the printed circuit board and thermally engaging with the heat generating electronic component;
   a fan attached to the heat sink for generating a force airflow flowing through the heat sink, the fan having two lateral longitudinal sides; and
   a fan duct comprising a first open portion with a first opening located close to the fan, a pair of lateral flanges located at lateral sides of the first opening, respectively, each lateral flange having a guiding rail extending in a direction toward the first opening and a latch, the guiding rail and the latch respectively engaging faces of a corresponding longitudinal side of the fan, and a second open portion defining a second opening communicating with the plurality of apertures of the second panel of the enclosure;
   wherein the first and second openings are oriented to be perpendicular to each other; and
   wherein fan duct further comprises at least one resilient tab extending from second open portion beside the second opening and engaging with the second panel.

13. The electronic system of claim 12, wherein the guiding rail of each of the lateral sides of the first open portion has an end remote from the second open portion, the end having a bevel formed thereon.

14. The electronic system of claim 12, wherein the second open portion of the fan duct forms a step adjacent to the first open portion, the step abutting against a top portion of the fan.

15. The electronic system of claim 14, wherein the first open portion comprises a mounting flange connected with the lateral flanges thereof the mounting flange abutting against a bottom portion of the fan, the step and the mounting flange being located at two opposite top and bottom sides of the first opening and cooperatively restricting the fan duct to move relative to the fan.

\* \* \* \* \*